United States Patent [19]
Campardo et al.

[11] Patent Number: 6,151,251
[45] Date of Patent: Nov. 21, 2000

[54] MEMORY CELL INTEGRATED STRUCTURE WITH CORRESPONDING BIASING DEVICE

[75] Inventors: Giovanni Campardo, Bergamo; Stefano Zanardi, Seriate; Maurizio Branchetti, San Polo D'Enza; Stefano Ghezzi, Treviolo, all of Italy

[73] Assignee: STMicroelectronics S.r.l., Agrate Brianza, Italy

[21] Appl. No.: 09/295,667

[22] Filed: Apr. 21, 1999

[30] Foreign Application Priority Data

Apr. 22, 1998 [EP] European Pat. Off. ............. 98830238

[51] Int. Cl.[7] .................................................. G11C 11/34
[52] U.S. Cl. ................................. 365/185.24; 365/185.27
[58] Field of Search ............................. 365/226, 185.24, 365/185.27

[56] References Cited

U.S. PATENT DOCUMENTS

| | | | |
|---|---|---|---|
| 5,243,559 | 9/1993 | Murai ....................................... | 365/185 |
| 5,461,338 | 10/1995 | Hirayama et al. ....................... | 327/534 |
| 5,548,146 | 8/1996 | Kuroda et al. ........................... | 257/321 |
| 5,576,995 | 11/1996 | Sato et al. ............................ | 365/185.33 |

FOREIGN PATENT DOCUMENTS 0 714 099 A1  5/1996  European Pat. Off. .

*Primary Examiner*—David Nelms
*Assistant Examiner*—M. Tran
*Attorney, Agent, or Firm*—Theodore E. Galanthay, Esq.; Robert Iannucci, Esq.; Seed IP Law Group, PLLC

[57] ABSTRACT

A biasing device for biasing a memory cell having a substrate bias terminal associated therewith. The biasing device includes a first sub-threshold circuitry block adapted to supply an appropriate current during the device standby phase through a restore transistor connected between a supply voltage reference and the substrate bias terminal of the memory cell, and having a control terminal connected to a bias circuit, in turn connected between the supply voltage reference and a ground voltage reference to drive the restore transistor with a current of limited value. The device further includes a second feedback block for fast charging the substrate bias terminal, being connected between the supply voltage reference and the ground voltage reference and comprising a first bias transistor having a control terminal connected to the ground voltage reference via a stabilization transistor, having in turn a control terminal connected to an output node, and to the control terminal of a first regulation transistor connected between the supply voltage reference and the ground voltage reference, the stabilization transistor and first regulation transistor providing feedback for the bias transistor, thereby to restrict the voltage range of the output node.

15 Claims, 4 Drawing Sheets

MEMORY CELL INTEGRATED STRUCTURE WITH CORRESPONDING BIASING DEVICE

TECHNICAL FIELD

This invention relates to an integrated structure for memory cells.

The invention also relates to a device for biasing a memory cell having at least one substrate bias terminal associated therewith.

The invention concerns, particularly but not exclusively, the use of the integrated structure for memory cells and the biasing device in a condition of low supply voltage, and the description herein will make reference to this field of application for convenience of explanation.

BACKGROUND OF THE INVENTION

As is well known, a non-volatile memory cell is read by means of a current-to-voltage conversion, suitably biasing the cell in a way that, when the stored information has a first logic value of "1", the cell is able to draw current.

In particular, for a proper memory cell reading operation, the current drawn by the cell should be greater than a preset value, termed the reference value Iref, which is usually a function of the supply voltage Vcc.

On the other hand, where the information has a second logic value of "0", the current drawn should be less than the reference value Iref.

The latest generation memory devices use values of the supply voltage Vcc ever so much smaller that a proper reading of memory cells becomes increasingly more of a problem.

In fact, discriminating between an erased cell (first logic value "1") and a written cell (second logic value "0") is only possible if the erased cell is able to draw a larger current than the reference value Iref, and this can only be if the voltage applied to the gate terminal of the cell in the reading phase, which is normally the same as the supply voltage Vcc, is higher than the cell threshold voltage.

For proper performance of the reading operation, there are available a number of circuit modifications which are primarily concerned with distributing the values of the threshold voltages Vth of the erased memory cells. The highest value of a threshold voltage Vth for an erased cell currently sets in the 2.5V range.

SUMMARY OF THE INVENTION

An embodiment of this invention provides an integrated structure and a biasing device for memory cells, which have such constructional and functional features as to overcome the constraints from the distribution of the threshold voltage values which still beset prior art memory devices.

Specifically, the integrated structure for memory cells is formed over a semiconductor substrate doped with a first dopant type and including at least one memory cell, in turn formed in a conductive well provided in said semiconductor substrate and doped with a second dopant type, said conductive well having an additional substrate well formed therein which is doped with the first dopant type and comprises active areas of the memory cell.

The biasing device of the embodiment includes a first sub-threshold circuitry block adapted to supply an appropriate current during the device standby phase through a restore transistor connected between a supply voltage reference and the substrate bias terminal of the memory cell.

The circuitry block also includes a control terminal connected to a bias circuit, in turn connected between the supply voltage reference and a ground voltage reference to drive the restore transistor with a current of limited value.

An embodiment of the invention is also directed to a method that only modifies the value of the threshold voltage of a memory cell during the reading phase, by body effect.

In particular, this concept can be applied to the instance of memory cells formed by a triple well process. In fact, the presence of a triple well enables a cell matrix to be placed within a substrate well which represents a region of isolation from a substrate portion where the external circuitry of the matrix is accommodated.

In this way, the different substrates can be biased at different voltages, thereby allowing the body effect to be restricted to just the reading phase.

The features and advantages of the invention can be better understood by having reference to the following description of embodiments thereof, to be read as non-limitative examples in conjunction with the accompanying drawings.

DETAILED DESCRIPTION

Figure 1:
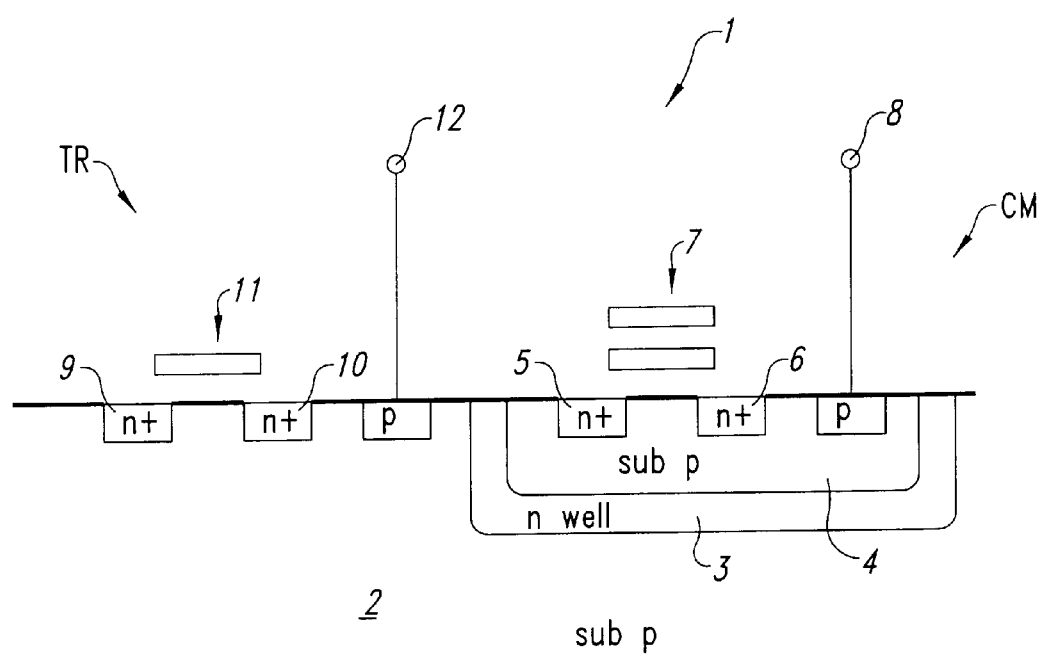
FIG. 1 shows schematically, to an enlarged scale, a portion of a semiconductor substrate wherein an integrated structure for memory cells according to an embodiment the invention is provided.

Referring to the drawing figures, generally and schematically shown at 1 is an integrated memory cell structure according to an embodiment of the invention.

The integrated memory cell structure 1 comprises a semiconductor substrate 2 doped with dopant of a first type (e.g., P).

To realize a memory cell CM according to a triple well process, in the semiconductor substrate 2 is formed a conductive well 3, which is doped with dopant of a second type (e.g., N) and has an additional well 4 doped with the first-type dopant formed therein to accommodate the active areas 5 and 6 of the memory cell CM.

In particular, the semiconductor substrate 2 and additional well 4 are p-doped, while the conductive well 3 is n-doped, in the example of FIG. 1.

Also, the memory cell CM of FIG. 1 has a floating gate terminal 7 formed above the active areas 5 and 6, and a first substrate bias terminal 8 connected to the additional well 4.

The integrated memory cell structure 1 in FIG. 1 further includes a select transistor TR which has active areas 9 and 10 formed in the semiconductor substrate 2.

The select transistor TR also has a gate terminal 11 formed above the active areas 9 and 10, and a second substrate bias terminal 12 connected to the semiconductor substrate 2.

Advantageously, the active areas 5 and 6 of the memory cell CM are formed in the additional well 4, which is physically separated from the semiconductor substrate 2 where the active areas of the external circuitry of the memory cell CM are formed.

Thus, the integrated structure 1 for memory cells according to the invention has first 8 and second 12 substrate bias terminals which are separated from each other.

By applying a bias voltage Vpol to the first substrate bias terminal 8, and hence to the additional well 4 of the memory cell CM, the cell threshold voltage Vth can be lowered—by means of the body effect—and a larger current can be taken up by the cells for the same supply voltage Vcc being applied.

By virtue of this increased current request, the reliability of the cell reading process can be improved in a memory cell CM according to the invention, even at low values of the supply voltage Vcc.

Figure 2:
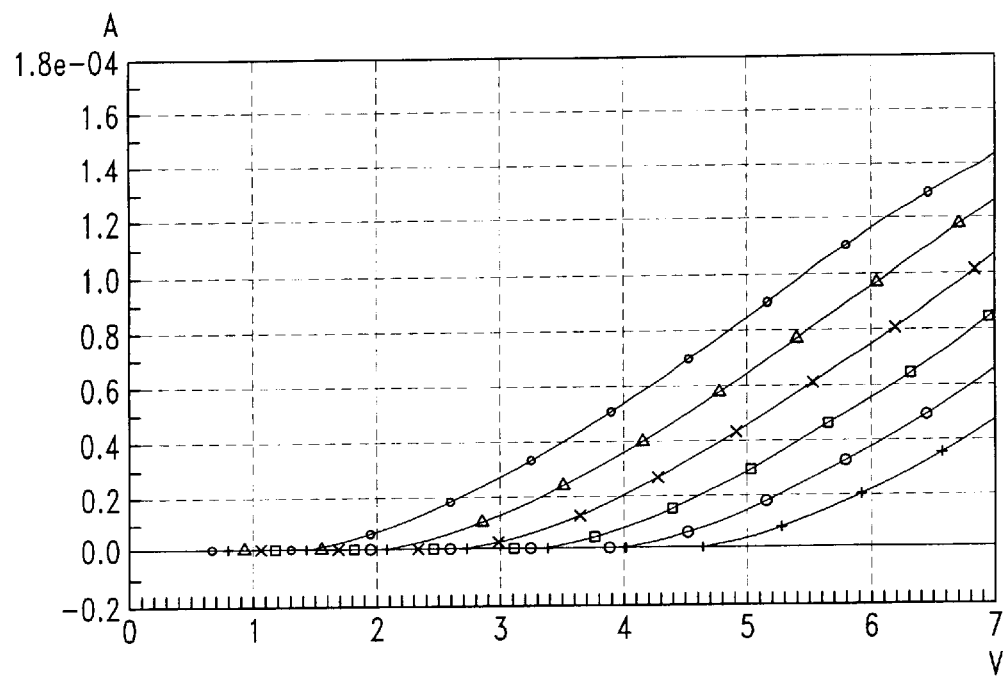
FIG. 2 is a graphical representation of an internal potential signal to the structure of FIG. 1, in a first operational condition.

Shown in FIG. 2 are characteristic curves for memory cells at different threshold voltages values; in particular, the curves in FIG. 2 illustrate variations in the current drawn as the supply voltage Vcc varies. The curves are for cells with threshold values that vary from a highest threshold value for the lowest curve to a lowest threshold value for the highest curve.

Figure 3:
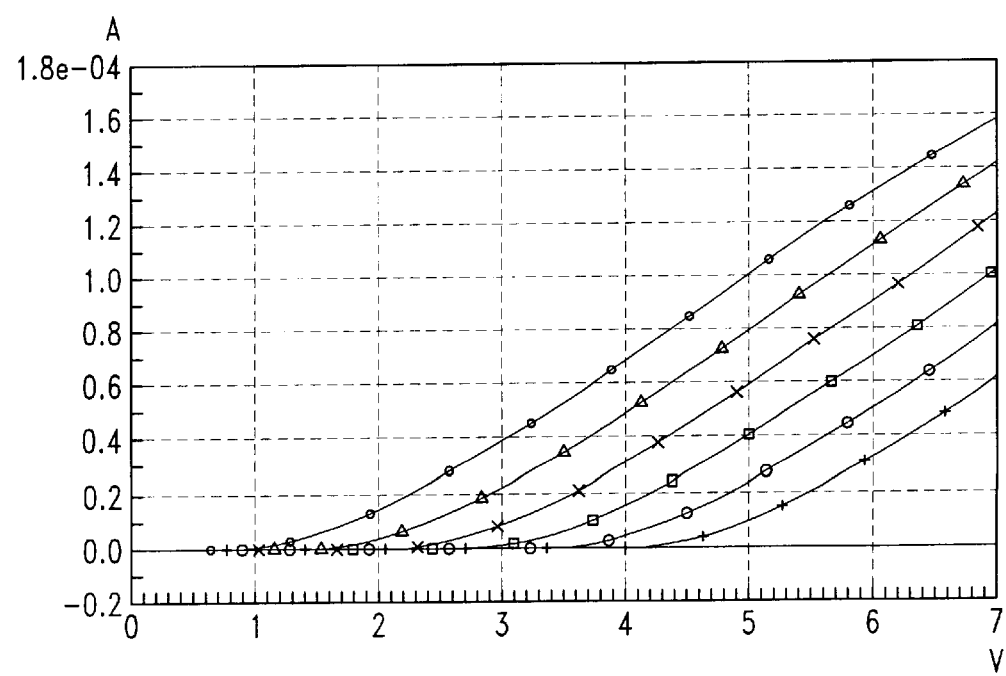
FIG. 3 is a graphical representation of an internal potential signal to the structure of FIG. 1, in a second operational condition.

FIG. 3 shows characteristic curves for the same cells, as a 0.5V voltage is applied to the first substrate bias terminal 8 and, hence, to the additional well 4, illustrating the shifts in value of the current request and, therefore, of the cell threshold voltage, which threshold voltage is largely dependent on the amount of charge stored on the floating gate terminal.

In the use of a memory cell CM according to the invention, as suitably biased through its first substrate bias terminal 8, some limitations on circuitry incorporating such a memory cell CM should be considered.

Firstly, the value of the bias voltage Vpol can and should not exceed the conduction threshold of parasitic diodes present in the integrated memory cell structure 1.

Figure 4:
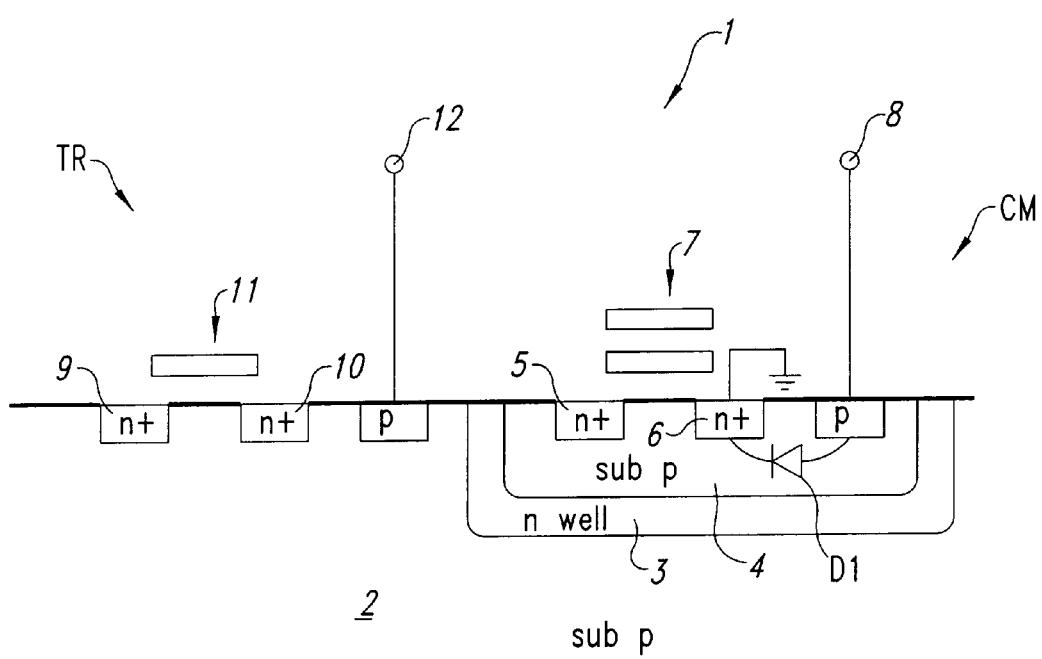
FIG. 4 shows in further detail the integrated structure for memory cells of FIG. 1.

In particular, a parasitic diode D1 is formed by the semiconductor substrate 2 and the active area 6, that is an n-junction providing the source terminal of the memory cell CM, as shown in FIG. 4, where the active area 6 of the memory cell CM has been connected to a ground voltage reference GND. This parasitic diode D1 prevents the first substrate bias terminal 8 from attaining the value of the supply voltage Vcc.

Secondly, during the power-on phase of a biasing device which includes the memory cell CM, the parasitic capacitances formed of the semiconductor substrate 2 and the r-type active areas 5 and 6 should be charged at the fastest possible rate, such that the Triggering of the device operative phase can take place within a short time. These parasitic capacitances can have indeed large values which are tied to the dimensions of the n-type conductive well 3.

Finally, during the standby phase, when the biasing device including the memory cell CM is on but "inactive" as regards its functions, consumption should be kept quite low.

Thus, a major problem is created by the leakage current which is bound to appear at any junctions or doped areas. This leakage current tends to discharge previously charged parasitic capacitances, triggering the biasing device operative phase. It is therefore necessary to hold these parasitic capacitances constantly latched to the supply voltage reference Vcc.

It should be noted, however, that the junctions of the memory cell CM are brought, rather than to the value of the supply voltage Vcc, to that of a stable intermediate voltage which is to be generated by voltage division; all this increases consumption.

Figure 5:
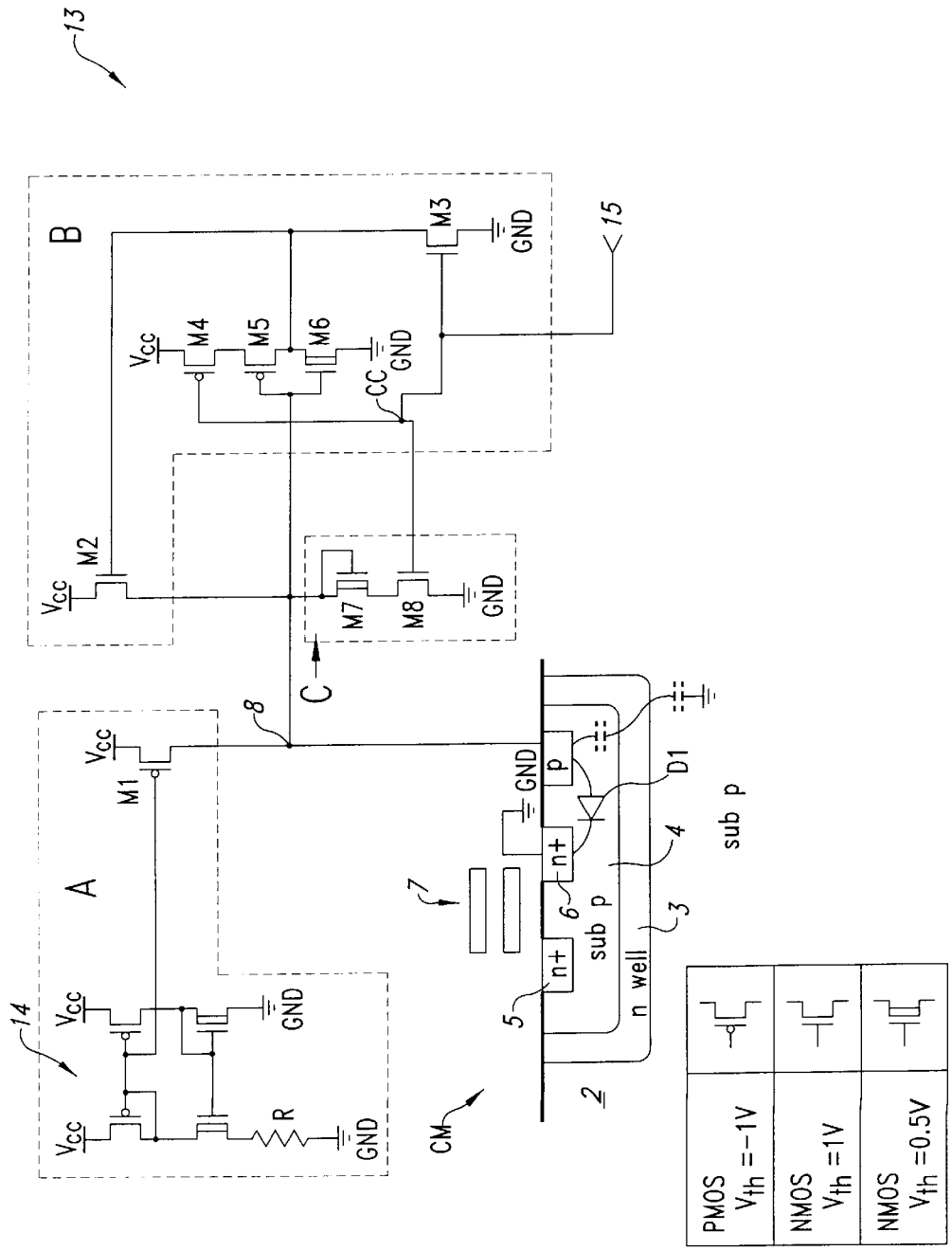
FIG. 5 shows a biasing device for a memory cell which has been formed using the integrated structure of FIG. 1.

A possible circuit diagram of a biasing device 13 including the memory cell CM is shown in FIG. 5.

In FIG. 5, the same reference numerals are used for the elements of the memory cell CM as in FIGS. 1 and 4. FIG. 5 also shows some of the main parasitic capacitances involved.

The biasing device 13 comprises a first block A which includes sub-threshold circuitry effective to provide the required current for restoring the leakage current during the standby phase through a restore transistor M1.

The first block A includes a bias circuit 14 connected between the supply voltage reference Vcc and the ground voltage reference GND, and connected to the gate terminal of the restore transistor Ml, in turn connected between the supply voltage reference Vcc and the first substrate bias terminal 8 of the memory cell CM. The bias circuit 14 allows the restore transistor M1 to be driven by a current of limited value.

It should be noted that the sub-threshold circuitry in block A is operative in all conditions, not being associated with an enable signal.

The biasing device 13 further comprises a second block B which includes a feedback circuit for fast-rate charging the first substrate bias terminal 8.

The second block B is connected between the supply voltage reference Vcc and the ground voltage reference GND and includes a first bias transistor M2 which is in turn connected between the supply voltage reference Vcc and the first substrate bias terminal 8 of the memory cell CM.

The bias transistor M2 has its gate terminal connected to the ground voltage reference GND through a stabilization transistor M3 which has its gate terminal connected to an external enable terminal 15 and to the gate terminal of a first regulation transistor M4.

The first regulation transistor M4 is connected between the supply voltage reference Vcc and a second regulation transistor M5, in turn connected to the ground voltage reference GND via a third regulation transistor M6. Furthermore, the second M5 and third M6 regulation transistors have their gate terminals connected together and to the first substrate bias terminal 8 of the memory cell CM.

Advantageously, the second M5 and third M6 regulation transistors are selected to be suitably unbalanced, i.e., the second regulation transistor M5 is a PMOS with a threshold voltage of 1V while the third regulation transistor is an NMOS with a threshold voltage of 0.5V.

The stabilization transistor M3 and regulation transistors M4, M5, M6 provide feedback for the bias transistor M2 which is delivering current.

The second block B also includes an output node OC whose voltage range is limited by the value of the threshold voltage of the stabilization transistor M3.

Advantageously, the bias transistor M2 is a large-size transistor, so that its charging phase can be fast. On this account, the second block B consumption is high, and the block must be held 'off' in the standby condition.

The biasing device 13 also comprises a third block C connected between the first substrate bias terminal 8 and the ground voltage reference GND, and connected to the output node OC of the second block B.

The third block C includes a series of a first, diode-connected enable transistor M7 and a second enable transistor M8.

In the embodiment shown in FIG. 5, the restore transistor M1 and regulation transistors M4, M5 are PMOS transistors, illustratively having a threshold voltage value of −1V. Moreover, the first bias transistor M2, stabilization transistor M3, and second enable transistor M8 are NMOS transistors, illustratively having a threshold voltage value of 1V. Finally, the third regulation transistor M6 and first enable transistor M7 are NMOS transistors with a reduced threshold, illustratively down to 0.5V.

An enable signal, such as the chip enable signal used in conventional memory devices, applied to the external enable terminal 15, is a logic 'low' value in normal operation, thereby turning off the second enable transistor M8. The enable signal is pulled to a logic 'high' value in the standby condition, thereby turning on transistor M3 which turns off the transistor M2, which is a source of consumption, and handing over to the first block A the task of maintaining the voltage value at the first substrate bias terminal 8 of the memory cell CM.

To avoid possible problems in the standby condition, such as a rise in the voltage at the first substrate bias terminal 8, the second enable transistor M8 in the block C is enabled to provide a discharge path for the first substrate bias terminal 8 through the first enable transistor M7. In this way, overtaking a preset alert threshold can be positively prevented.

In fact, with the first block A held always 'on' in the standby condition, the third block C will act as a switch to stop the voltage at the first substrate bias terminal 8 from rising and, accordingly, reduce the leakage voltages of the parasitic capacitances in the memory cell CM. In particular, the first block A could be used to regulate the voltage being applied to the first substrate bias terminal 8 until an optimum condition is reached for triggering the third block C.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A biasing device for a memory cell having a substrate bias terminal associated therewith, said biasing device comprising:

a sub-threshold circuitry blockstructured to supply an appropriate current during a standby phase of the device, the sub-threshold circuitry block including a restore transistor connected between a supply voltage reference and the substrate bias terminal of the memory cell, and having a control terminal; and a bias circuit connected between the supply voltage reference and a ground voltage reference and connected to the control terminal of the restore transistor to drive the restore transistor with a current of limited value; and a feedback block for fast charging the substrate bias terminal, being connected between the supply voltage reference and the ground voltage reference and including a bias transistor having a control terminal; a stabilization transistor connecting the control terminal of the bias transistor to the ground voltage reference and having a control terminal connected to an output node; and a first regulation transistor connected between the supply voltage reference and the ground voltage reference and having a control terminal connected to a control terminal of the stabilization transistor, said stabilization transistor and first regulation transistor providing feedback for the bias transistor, thereby to restrict the voltage range of the output node.

2. A biasing device according to claim 1, wherein said feedback block further comprises second and third regulation transistors connected in series with each other between the first regulation transistor and the ground voltage reference and having respective control terminals connected together and to the substrate bias terminal of the memory cell.

3. A biasing device according to claim 2, wherein said second and third regulation transistors are suitably unbalanced.

4. A biasing device according to claim 3, wherein said bias transistor is connected to the substrate bias terminal of the memory cell.

5. A biasing device according to claim 1, wherein said stabilization transistor has its control terminal further connected to an external device enable terminal.

6. A biasing device according to claim 1, further comprising a switching block connected between the substrate bias terminal and the ground voltage reference and connected to the output node of the feedback block so as to switch off said feedback block when in the standby condition and stop the substrate bias terminal voltage from rising.

7. A biasing device according to claim 6, wherein said switching block comprises a diode-connected first enable transistor and a second enable transistor connected in series with each other between the substrate bias terminal and the ground voltage reference.

8. A biased memory cell, comprising:

a cell transistor formed in a semiconductor substrate, the cell transistor including a substrate bias terminal;

a bias transistor coupled between a first voltage reference and the substrate bias terminal and having a control terminal;

a stabilization transistor coupled between the control terminal of the bias transistor and a second voltage reference and having a control terminal coupled to an enable signal; and a first regulation transistor coupled between the first voltage reference and the control terminal of the bias transistor, the first regulation transistor also having a control terminal coupled to the enable signal, the first regulation transistor being structured to be turned on by the enable signal while the stabilization transistor is turned off by the enable signal.

9. The biased memory cell of claim 8, further comprising:

a restore transistor coupled between the first voltage reference and the substrate bias terminal and having a control terminal; and a bias circuit coupled to the control terminal of the restore transistor, the bias circuit being structured to keep the restore transistor activated whenever power is supplied to the substrate bias current.

10. The biased memory cell of claim 9 wherein the bias transistor is larger than the restore transistor and structured to charge the substrate bias terminal at a faster rate than the restore transistor.

11. The biased memory cell of claim 8, further comprising an enable transistor coupled between the substrate bias terminal and the second voltage reference and having a control terminal coupled to the enable signal, the enable transistor being structured to be activated by the enable signal when the stabilization transistor is activated by the enable signal.

12. The biased memory cell of claim 8, further comprising:
- a second regulation transistor coupled between the first regulation transistor and the control terminal of the bias transistor and having a control terminal coupled to the substrate bias terminal; and
- a third regulation transistor coupled between the second voltage reference and the control terminal of the bias transistor and having a control terminal coupled to the substrate bias terminal, the third regulation transistor being structured to active when the second regulation transistor is inactive.

13. The biased memory cell of claim 8 wherein the cell transistor, including the substrate bias terminal, is formed within a first well that is formed within a second well of the substrate, the substrate and first well being doped with a first dopant type arid the second well being doped with a second dopant type opposite to the first dopant type.

14. A method of biasing a substrate bias terminal of a memory cell integrated on a semiconductor substrate, the method comprising:

- connecting the substrate bias terminal with a positive bias via a relatively high current path during a read operation of the memory cell, the positive bias being sufficient to establish a relatively low threshold voltage in the memory cell during the read operation;
- interrupting the relatively high current path when the read operation has concluded; and
- keeping the substrate bias terminal connected to the positive bias via a relatively low current path both while the substrate bias terminal is connected by the relatively high current path and while the relatively high current path is interrupted.

15. The method of claim 14 wherein the keeping act includes coupling the substrate bias current through a transistor to a ground voltage reference while the relatively high current path is interrupted.

* * * * *

UNITED STATES PATENT AND TRADEMARK OFFICE
CERTIFICATE OF CORRECTION

PATENT NO. : 6,151,251
DATED : November 21, 2000
INVENTOR(S) : Giovanni Campardo et al.

It is certified that error appears in the above-identified patent and that said Letters Patent is hereby corrected as shown below:

Column 7, claim 13,
Line 17, "arid the second well" should read as -- and the second well -- in the issued patent.

Signed and Sealed this

Twenty-sixth Day of March, 2002

Attest:

JAMES E. ROGAN
*Attesting Officer*     *Director of the United States Patent and Trademark Office*